US006353308B1

(12) United States Patent
Ranta-aho et al.

(10) Patent No.: US 6,353,308 B1
(45) Date of Patent: Mar. 5, 2002

(54) METHOD FOR ARRANGING THE VOLTAGE FEED IN AN ELECTRONIC DEVICE

(75) Inventors: Karri Ranta-aho; Jyri Rauhala, both of Tampere; Tommi Leino, Hämeenkyrö , all of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/578,012

(22) Filed: May 24, 2000

(30) Foreign Application Priority Data

May 27, 1999 (FI) ............................................... 991205

(51) Int. Cl.[7] .............................. G05F 1/56; H03K 3/01
(52) U.S. Cl. ....................................... 323/266; 327/535
(58) Field of Search ................................ 323/266, 272, 323/282, 283, 284, 285, 286; 327/538, 543, 535

(56) References Cited

U.S. PATENT DOCUMENTS 4,176,309 A 11/1979 Schulz et al. .................. 323/4
4,428,015 A * 1/1984 Nesler ......................... 361/18
4,560,918 A 12/1985 Callen ........................ 323/273
5,271,393 A * 12/1993 Horiguchi et al. .......... 327/535
5,276,361 A * 1/1994 Bartlett ....................... 327/535
5,412,556 A * 5/1995 Marinus .................. 363/21.05
5,502,416 A * 3/1996 Pietrobon ................... 327/538
5,514,995 A 5/1996 Hennig ....................... 327/399
5,530,395 A * 6/1996 Ting ........................... 327/543

FOREIGN PATENT DOCUMENTS

EP 0 676 855 A2 10/1995

OTHER PUBLICATIONS

IBM Technical Disclosure Bulletin "Supplementary Power Circuit in a Multiple Power Supply System", XP–002147322, Jul. 7, 1996, vol. 39, pp. 293–294.

* cited by examiner

*Primary Examiner*—Rajnikant B. Patel
(74) *Attorney, Agent, or Firm*—Perman & Green, LLP

(57) ABSTRACT

The invention relates to a method for forming an operating voltage ($V_{CC2}$) for an electronic device (1) from a supply voltage ($V_{S2}$) by means (7, 8) for forming the operating voltage. In the method, a minimum value ($V_{min}$) and a maximum value ($V_{max}$) are defined for the operating voltage ($V_{CC2}$). The means (7, 8) for forming the operating voltage are provided with at least a first operating voltage supply block (7) and a second operating voltage supply block (8). In the first operating voltage supply block (7), the output voltage is limited smaller than said maximum value ($V_{max}$) for the operating voltage. Furthermore, at least a first limit value (V3) is determined, and the supply voltage ($V_{S2}$) is compared with said first limit value (V3), wherein if the supply voltage ($V_{S2}$) is greater than said first limit value (V3), the first operating voltage supply block (7) is activated to form the operating voltage ($V_{CC2}$) from the supply voltage ($V_{S2}$). If the supply voltage ($V_{S2}$) is substantially smaller than said first limit value (V3), the second operating voltage supply block (8) is activated to form the operating voltage ($V_{CC2}$) from the supply voltage ($V_{S2}$).

11 Claims, 3 Drawing Sheets

METHOD FOR ARRANGING THE VOLTAGE FEED IN AN ELECTRONIC DEVICE

Figure 1:
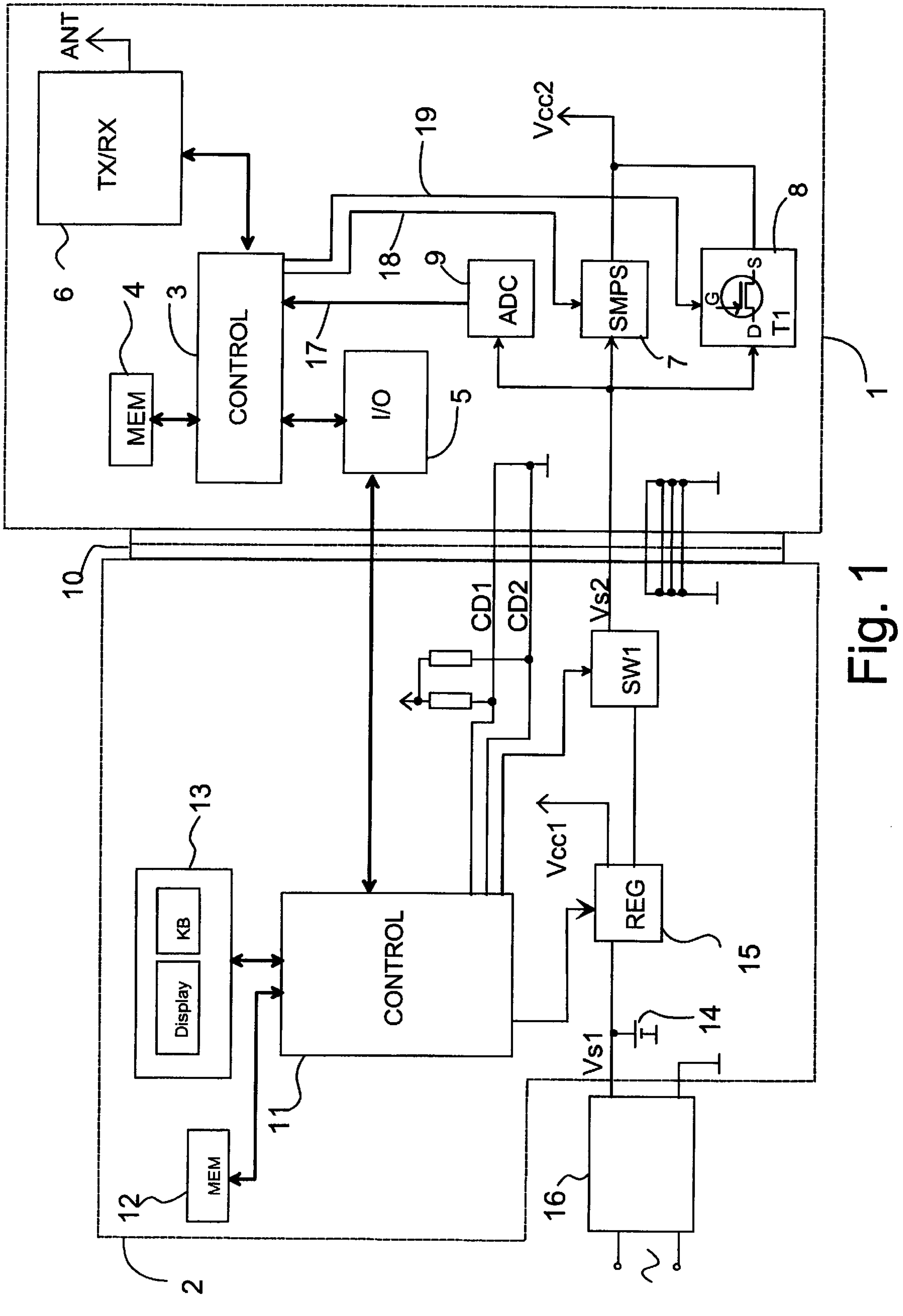

The present invention relates to a method for forming an operating voltage for an electronic device from a supply voltage by means for forming the operating voltage, in which method a minimum value and a maximum value are defined for the operating voltage. The invention relates also to an electronic device comprising means for forming an operating voltage, to form the operating voltage from a supply voltage, a minimum value and a maximum value being defined for the operating voltage.

BACKGROUND

A typical operating voltage value in integrated circuits, such as TTL circuits, has been 5 V±5%. This has led to the fact that several electronic devices have been designed to operate with the operating voltage of 5 V. In the design of integrated circuits, one important criterion is the so-called power density (W/mm$^2$), which may, in turn, limit increasing the integration density. Reducing the operating voltage is one way of increasing the integration density whereby the power density value is retained in the allowed limits; consequently, circuit solutions have been developed which operate also at 3.3 V and even at 3.0 V. In portable electronic devices, a lower operating voltage also has the advantage that the power supply unit can be made smaller and lighter in weight, particularly if the power consumption does not require the use of high-capacity power supply.

Electronic devices have been developed, in which the allowed supply voltage range can be very wide, for example from 3.0 V to 5.5 V. One reason for such a wide range of supply voltage has been the compatibility of the electronic device to devices with different operating voltages. This is important e.g. in such electronic devices which are intended to be coupled to another device. One example that should be mentioned is expansion cards to be coupled to data processors. Such expansion cards can be used to change the properties of the data processors. It is possible to connect e.g. modem cards, network cards, audio cards, etc. to data processors, such as computers, wherein the computer can be used as a remote terminal or as a work station in the local area network of an office. By means of an audio card, the computer can be used to generate various audio signals and to perform digital signal processing.

Corresponding expansion card solutions, such as PCMCIA expansion cards, have also been developed for e.g. portable computers. The portable computer can be connected for example to a card-like wireless communication device with functions of a wireless communication device, such as mobile station functions. Thus, the portable computer can be used as a wireless modem, a mobile station, a wireless work station, etc. Typically, such an expansion card receives its operating voltage from the device to which the expansion card is connected. For the voltage supply of PCMCIA cards, several different operating voltages have been defined, e.g. 3.3 V and 5 V. Depending on the manufacturer or the type, the expansion card may require a certain voltage or it may operate with any of these voltages. Nevertheless, all the devices to which the expansion card can be connected do not necessarily have all said supply voltages available for the expansion card. Therefore, this possibility must be taken into account in the arrangements for the operating voltage of the expansion card, if the expansion card is intended to be compatible with as many devices as possible.

One such solution for forming the operating voltage of such an expansion card, or another electronic device, is that the expansion card is designed to function with the lowest allowed operating voltage value, and the operating voltage is set to this lowest value in the operating voltage supply block irrespective of the supply voltage, if it is within the allowed range. In the design, also certain ranges of variation (tolerances) are normally taken into account, wherein the expansion card will still function at an even smaller operating voltage than that designed. For example, if the expansion card is designed to operate at 3.3 V and the tolerance is 10%, the smallest operating voltage at which the expansion card will still function in a sufficiently reliable way, is ca. 3 V.

The above-mentioned reduction in the voltage will cause that some of the supply voltage will be converted to heat in the operating voltage supply block. Consequently, the greater the required reduction in the voltage, the greater typically the loss of power. Moreover, in case the supply voltage is close to the smallest allowed value, the power loss in the operating voltage supply block may cause that the operating voltage is below the allowed minimum. In a switched mode power supply (SMPS), the voltage reductions is brought about with a relatively good power transfer ratio, i.e. the power loss has been reduced. However, also this voltage supply solution has the problem that when the supply voltage is close to the allowed minimum value, the operating voltage supply block causes a voltage loss, which is typically some hundreds of millivolts, wherein the operating voltage to be supplied to the electronic device is below the minimum value. As a result, the electronic device does not necessarily function in a sufficiently reliable way in all situations.

SUMMARY

It is an aim of the present invention to achieve a method in the voltage supply for an electronic device in such a way that a sufficient operating voltage can be secured for the electronic device also in the situation that the supply voltage is close to the determined minimum. The invention is based on the idea of forming two voltage supply circuits, of which the first one is used in a situation in which the difference between the supply voltage and the operating voltage is relatively large and, in a correrponding manner, with small differences between the supply voltage age the operating voltage, the second operating voltage supply circuit is used. The method according to the present invention is characterized in that in the method, the means for forming the operating voltage are provided with at least a first operating voltage supply block and a second operating voltage supply block, in which first operating voltage supply block the output voltage is limited smaller than said maximum value for the operating voltage; that at least a first limit value is determined; and that the supply voltage is compared with said first limit value, wherein if the supply voltage is greater than said first limit value, the first operating voltage supply block is activated to form the operating voltage from the supply voltage, and if the supply voltage is substantially smaller than said first limit value, the second operating voltage supply block is activated to form the operating voltage from the supply voltage. The electronic device according to the present invention is characterized in that the means for forming the operating voltage comprise at least a first operating voltage supply block and a second operating voltage supply block, in which first operating voltage supply block the output voltage is limited to be lower than said maximum value for the operating voltage; that at least a first limit value is defined in the electronic device; and that the electronic device also comprises comparing means for comparing the supply voltage and said first limit value, and control means for activating the first operating voltage supply block if the supply voltage is greater than said first limit value and for activating the second operating voltage supply block if the supply voltage is substantially lower than said first limit value.

Considerable advantages are achieved by using the present invention in comparison with solutions of prior art. Using the method of the invention, the operation of the electronic device can be secured on a wide range of supply voltage and it is still possible to maintain a good power transfer ratio also at higher supply voltages.

In the following, the invention will be described in more detail with reference to the appended drawings, in which

DRAWINGS

Figure 2:
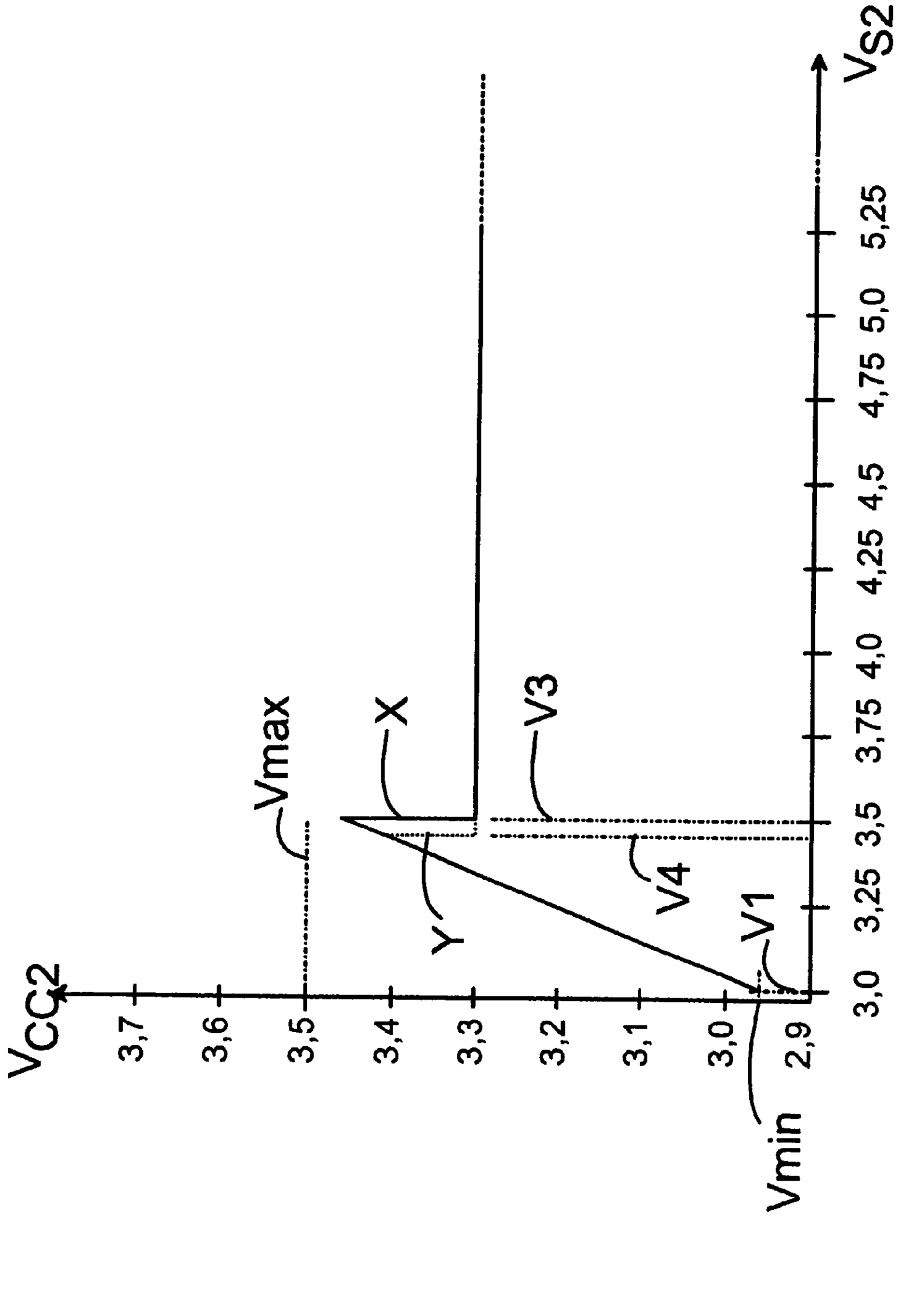
Figure 3:
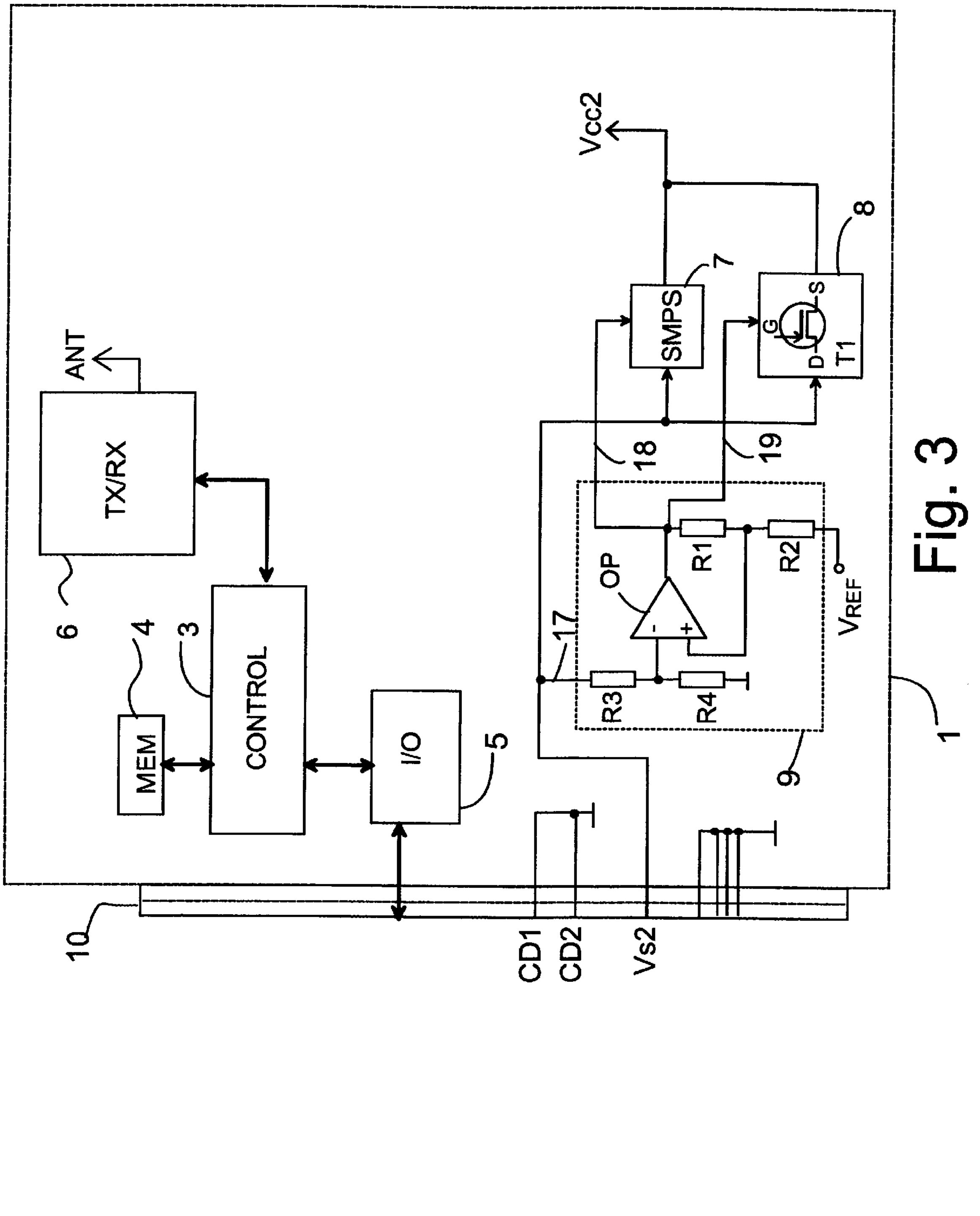

FIG. 1 shows an electronic device according to a first advantangeous embodiment of the invention, FIG. 2 shows the operating voltage of an expansion card in an electronic device according to FIG. 1 as a function of the supply voltage, and FIG. 3 shows an electronic device according to a second advantageous embodiment of the invention.

DESCRIPTION OF THE EMBODIMENTS

In the following, the invention will be described by using as an example of the electronic device an expansion card 1 which can be connected to e.g. a data processor 2. In this example, the expansion card 1 is a cardlike wireless communication device. However, it is obvious that the invention is not limited solely to this embodiment but the electronic device can also be an electronic device of another type than a card-like wireless communication device or another expansion card.

In the arrangement of FIG. 1, the expansion card 1 comprises e.g. a control block 3. This control block 3 can consist of one or more processors, such as a microcontroller, a digital signal processing unit, or the like. Moreover, the control block 3 can comprise an application specific integrated circuit (ASIC), which is known per se. The expansion card 1 comprises also memory means 4 consisting preferably of a read only memory (ROM) and/or a random access memory (RAM). The random access memory can also comprise a non-volatile random access memory (NVRAM) e.g. for the storage of such changeable data which should be kept in the storage also when the operating voltage is turned off from the expansion card 1. Furthermore, the expansion card 1 according to FIG. 1 comprises a radio part 6 which consists, in a way known per se, of mobile station functions, wherein the expansion card 1 can be used e.g. as a wireless modem for a data processor 2. The expansion card 1 is connected to the data processor 2 or to another device by means of a connector 10. The data processor 2 is thus equipped with a corresponding connection arrangement for leading the necessary signals via the connector 10 between the data processor 2 and the expansion card 1. In this embodiment, the required operating voltages are also led to the expansion card 1 via this connector 10.

To form the operating voltages for the expansion card 1, the expansion card is preferably equipped with operating voltage forming means 7, 8. These operating voltage forming means consist of a first operating voltage supply block 7, which is preferably a switched mode power supply SMPS, but also other voltage transformer solutions can be used. The second operating voltage supply block 8 is in this embodiment implemented with a FET transistor T1 which has a relatively low on drain resistance $R_{DSON}$, preferably some tens of milliohms, and a relatively high off drain resistance $R_{DSOFF}$, preferably in the order of $10^9\Omega$. Furthermore, the operating voltage forming block comprises a supply voltage measuring means 9, such as an analog/digital converter ADC. The operation of this supply voltage forming block will be described below in this specification.

The data processor 2 comprises preferably a data processing block 11, such as a microprocessor or the like. The data processing block 11 can also comprise other data processing means, but the structure of the data processing block 11 is not relevant for the application of the present invention, whereby it does not need to be described in more detail in this context. Further, the data processing device 2 comprises memory means 12 for the storage of application software, data during the use, etc. Moreover, the data processor 2 has a user interface 13 which consists preferably of at least a keyboard KB and a display device DISPLAY. In addition, the user interface 13 may comprise audio means, such as a microphone and an earpiece (not shown).

The data processor 2 is supplied with an operating voltage $V_{CC1}$ from a power supply 14 by means of a power supply block 15. The power supply 14 is e.g. a battery which can be charged, when necessary, with a mains power supply 16, or another power supply known per se. The voltage supplied by the power supply 14 is conducted to the power supply block 15, where this voltage $V_{S1}$ of the power supply is used to form one or more operating voltages $V_{CC1}$ needed for the operation of the data processor 2. Furthermore, the voltage $V_{S1}$ of the power supply is use(d to form a supply voltage $V_{S2}$ for the expansion card, which can be the same voltage as the operating voltage $V_{CC1}$ for the data processor.

When the data processor 2 is turned on, the data processing block 11 takes initialization measures to start the operations of the data processor 2 in a way known per se. In connection with the start-up, the data processing block 11 also examines the status of card identification lines CD1, CD2 to find out if the expansion card 1 is connected to the data processor 2. In the connection of FIG. 1 in a case in which the expansion card 1 is not connected to the data processor 2, the voltage of these card identification lines CD1, CD2 is close to the operating voltage $V_{CC1}$ of the data processor, that is, in this embodiment the card identification lines CD1, CD2 are in the logical 1 state. If the expansion card 1 is connected to the data processor 2, at least one card identification line CD1, CD2 is thus set in the second state, which in this embodiment corresponds to the logical 0 state. This is achieved by grounding at least one of the card identification lines CD1, CD2 in the expansion card 1. It is obvious that there can be more than two or only one of these card identification lines CD1, CD2.

If the data processing block 11 detects that the expansion card 1 is connected to the data processor 2, the data processing block 11 perform certain initialization measures e.g. to start the expansion card 1 and to set the functional parameters. The data processing block 11 switches the supply voltage $V_{S2}$ of the expansion card to the connector 10 preferably by turning a switch SW1 off. Thus, the supply voltage $V_{S2}$ is conducted via the connector 10 to the operating voltage transforming block 7, 8, 9 in the expansion card 1. It is obvious that also other voltages can be conducted via the connector 10 to the expansion card 1.

The expansion card 1 is not connected to the data processor 2 when the data processor is turned on. Thus, the connection of the expansion card can be detected from a state change of at least one card identification line CD1, CD2, wherein the supply voltage $V_{S2}$ is switched to the expansion card and the operation substantially corresponds to the above-presented initialization of the expansion card 1 in other respects as well.

Let us assume that in a situation when the operating voltage $V_{CC1}$ is switched to the expansion card 1, the first operating voltage supply block 7 performs generation of the operating voltage $V_{CC2}$ of the expansion card 1 from the supply voltage $V_{S2}$. This is achieved e.g. by activating the first operating voltage supply block 7 when the voltage of the first supply block control line 18 is low, ca. 0 V. Correspondingly, the second operating voltage supply block 8 is not activated when the voltage of the second supply block control line 19 is low, ca. 0 V. Thus, after switching of the supply voltage $V_{S2}$, the first operating voltage supple, block 7, whose output voltage is preferably limited irrespective of the input voltage value, will maintain the operating voltage $V_{CC2}$ of the expansion card sufficiently low, even though the control block 3 had not yet performed the initialization measures for the function of the expansion card 1. In this embodiment, the second operating voltage supply block 8 is implemented in such a way that it does not necessarily have a limit to the output voltage. At the stage when the operating voltage $V_{CC2}$ of the expansion card has reached preferably a minimum value V1, the control block 3 of the expansion card 1 is started and it performs the initialization measures to start the operation of the expansion card 1. At this stage, the operating voltage $V_{CC2}$ of the expansion card 1 is thus the voltage formed by the first operating voltage supply block 7. At the same time, the measurement of the supply voltage $V_{S2}$ of the expansion card is started in the expansion card 1 by means of a supply voltage measuring means 9. In this preferred embodiment, this supply voltage measuring means 9 is an analog/digital converter which forms a conversion result that is conducted in digital form via a measuring bus 17 to the control block 3. The control block 3 is equipped with an application program for processing the conversion results.

The following is a description on the processing of this measurement result in the arrangement according to the first embodiment of the invention. The conversion result is conducted at intervals via the measuring bus 17 to the control block. The width of this measuring bus 17 is e.g. 8 bits, wherein 256 different voltage values can be differentiated. The control block 3 reads this data on the measuring bus 17 and stores it in the memory means 4 or in internal registers (not shown) of the control block 3 for processing in a way known per se. The expansion card 1 also contains data stored on a first limit value V3 to which the measurement value is compared. In practical solutions, the expansion card 1 also contains a stored second limit value V4 which is slightly smaller than the first limit value V3. The difference between the first V3 and the second value V4 is called a hysteresis. By arranging this hysteresis,is to have a suitable value, it is possible to avoid that the control of the first supply block control line 18 and the second supply block control line 19 would start to oscillate when the supply voltage $V_{S2}$ is very close to said limit values V3, V4.

Let us assume that the allowed supply voltage range of the expansion card 1 is limited between a minimum value V1 and a maximum value (not shown). The minimum value V1 is e.g. 3.0 V and the maximum value is e.g. 15 V, but it is obvious that the present invention is not limited solely to these example values but they can vary in practical solutions.

The minimum value V1 of the supply voltage $V_{S2}$ depends primarily on the voltage loss of the second operating voltage supply block 8, because it is activated at lower supply voltages. The minimum value V1 of the supply voltage $V_{S2}$ is preferably the value of this voltage loss greater than the operating voltage minimum value $V_{min}$. The maximum value of the supply voltage $V_{S2}$ depends primarily on the voltage strength of the operating voltage supply blocks 7, 8. Let us also assume that the operating voltage $V_{CC2}$ allowed for the electronic device is limited between the minimum value $V_{min}$ and the maximum value $V_{max}$. The aim is to set this operating voltage $V_{CC2}$ as low as possible to maximize the efficiency in every use situation in such a way that the maximum value $V_{max}$ of the operating voltage fulfils the internal requirements of the electronic device 1. The first limit value V3 is selected preferably in such a way that the operating voltage $V_{CC2}$ of the electronic device 1 does not exceed the maximum value $V_{max}$ for the operating value, even if an operating voltage supply block with no limit for the output voltage were activated.

If the measurement result is greater than the first limit value V3, the control block 3 forms in the first supply block control line 18 a control whereby the first operating voltage supply block 7 is activated, and correspondingly in the second supply block control line 19 control whereby the second operating voltage supply block 8 is not activated. Thus, the operating voltage $V_{CC2}$ of the expansion card 1 is formed in the first operating voltage supply block 7. However, if the measurement result indicates that the supply voltage $V_{S2}$ of the expansion card 1 is lower than the first limit value V3 but higher than the second limit value V4, the control block 3 does not change the status of the control lines 18, 19. If the measurement result indicates that the supply voltage $V_{S2}$ is lower than the second limit value V4, the control block 3 forms in the first supply block control line 18 a control whereby the first operating voltage supply block 7 is not activated and, correspondingly, in the second supply block control line 19 a control whereby the second operating voltage supply block 8 is active. Thus, the operating voltage $V_{CC2}$ of the expansion card 1 is formed at least primarily in this second operating voltage supply block 8. In practice, this means that the supply voltage $V_{S2}$ to be conducted to the expansion card is directed via this second operating voltage supply block 8 to the operating voltage line $V_{CC2}$ of the expansion card.

In a practical solution, this second operating voltage supply block 8 is implemented e.g. with a switch, such as a FET transistor T1 (channel transistor) (FIG. 3). Thus, if the FET transistor T1 used is an n channel transistor and the supply voltage $V_{S2}$ is a positive voltage, the supply voltage $V_{S2}$ is conducted to the drain D of the FET transistor T1, wherein the source S is switched to the operating voltage line $V_{CC2}$. In a corresponding manner, if the FET transistor T1 used is a p channel transistor and the supply voltage $V_{S2}$ is a positive voltage, the supply voltage $V_{S2}$ is conducted to the source S of the FET transistor T1, and the drain D is switched to the operating voltage line $V_{CC2}$. The second supply, block control line 19 is coupled to the gate G of this FET transistor T1 The control of the FET transistor T1 is formed in such a way that when the second operating voltage supply block 8 is activated, the channel resistance $R_{DS}$ of the FET transistor is low (=$R_{DSON}$), in the order of some tens of milliohms, and the voltage loss over the FET transistor is small. In a corresponding manner, when the second operating voltage supply block 8 is non-active, this channel resistance $R_{DS}$ (=$R_{DSOFF}$) is typically some tens or hundreds of megaohms.

FIG. 2 shows the value of the operating voltage $V_{CC2}$ of the expansion card graphically as a function of the supply voltage $V_{S2}$. It can be seen from the figure that at small supply voltage values $V_{S2}$, wherein the operating voltage $V_{CC2}$ of the expansion card is formed by the second operating voltage supply block 8, the operating voltage $V_{CC2}$ is only slightly smaller than the supply voltage $V_{S2}$. In a situation in which the operating voltage $V_{CC2}$ of the expansion card is formed by the first operating voltage supply block 7, the operating voltage $V_{CC2}$ is substantially constant. This moment of change corresponding to the first limit value V3 is indicated with the reference X in FIG. 2. Correspondingly, when the supply voltage $V_{S2}$ is reduced, the moment of change corresponding to the second limit value V4 is indicated with the reference Y in FIG. 2.

It is obvious that the first operating voltage supply block 7 and the second operating voltage supply block 8 as well as the supply voltage measuring means 9 can also be implemented with other known arrangements. In the operation of the second operating voltage supply block 8, it is essential that the voltage loss is as small as possible, wherein a sufficient operating voltage for the expansion card 1 can be secured also in such situations in which the supply voltage $V_{S2}$ is close to the allowed minimum value V1. In a corresponding manner, the aim with the first operating voltage supply block 7 is to obtain as good an efficiency as possible in the voltage transformation and to limit the operating voltage $V_{CC2}$ under the determined maximum value $V_{max}$, when the supply voltage $V_{S2}$ is higher than the limit value V3, V4.

The following is a description of the operation of the arrangement according to a second preferred embodiment of the invention shown in FIG. 3. The difference here lies primarily in that the voltage measurement and the formation of the controls for the supply blocks 7, 8 are implemented with an analog coupling, wherein the control block 3 is not necessarily needed in this formation of the voltages. In this embodiment, the supply voltage measuring means 9 comprises e.g. an operational amplifier OP in which said first limit value V3 and second limit value V4 are set by means of resistances R1, R2 as well as with a reference voltage $V_{REF}$ to be conducted to the resistance R2. Thus, when the supply voltage $V_{S2}$ is higher than the first limit value V4, the output voltage of the operational amplifier is substantially 0 V. When the supply voltage $V_{S2}$ falls below the second limit value V4, the output voltage, of the operational amplifier OP is changed to a value which is close to the operating voltage $V_{CC2}$. In a corresponding manner, when the supply voltage exceeds the first limit value V3, the output voltage of the operational amplifier OP is changed back to a value of ca. 0 V. It is obvious that this coupling is shown in a reduced manner and that it is only an example application of the supply voltage measuring means 9.

The output voltage $V_{OP}$ of the operational amplifier OP is conducted to the gate G of the FET transistor T1. Since the FET transistor T1 in this example is an n channel transistor, the channel resistance $R_{DS}$ of the FET transistor T1 is in the high impedance state (=$R_{DSOFF}$) when the gate voltage is lower than the switching voltage of the FET transistor T1. The FET transistor T1 is thus in the high impedance state (switch off), when the output voltage of the operational amplifier OP is ca. 0 V, i.e. when the supply voltage $V_{S2}$ of the expansion card exceeds the first limit value V3. In a corresponding manner, when the output voltage $V_{OP}$ of the operational amplifier OP is sufficiently greater than the supply voltage $V_{S2}$, the FET transistor is in the low impedance state (=$R_{DSON}$, switch on). With different FET transistors of the n type, the required control voltage to be conducted to the gate is different, e.g. 5 to 6 V. The control voltage can also be dependent on the supply voltage $V_{S2}$.

The output voltage of the operational amplifier OP can be raised higher than the supply voltage $V_{S2}$ e.g. by forming the operating voltage of the operational amplifier OP higher than the supply voltage $V_{S2}$ e.g. by means of a separate voltage supply block (not shown), in which the voltage is raised by a method known per se. The voltage supply block can thus also be used for forming said reference voltage $V_{REF}$. Another alternative is that the output voltage $V_{OP}$ of the operational amplifier is conducted to a voltage transformer block (not shown), in which the output voltage $V_{OP}$ is transformed into a higher control voltage.

The output voltage $V_{OP}$ of the operational amplifier OP is also conducted to the first supply block control line 18. The first operating voltage supply block 7 is in this advantageous embodiment implemented in such a way that when the voltage of the control line 18 is ca. 0 V, the first operating voltage supply block is activated. Thus, for controlling the supply blocks 7, 8 of the operating voltages, one control means will be sufficient, in this advantageous embodiment the measuring block 9 consisting of the operational amplifier OP and the resistances R1, R2, R3 and R4. If necessary, the control lines 18, 19 can be equipped with inverters (not shown), by means of which the desired control is achieved to activate and deactivate the respective supply, block 7, 8 of the operating voltage used.

In the advantageous embodiments of the invention presented above, both operating voltage supply means 7, 8 act as voltage reducers. The invention can also be applied in such a way that i.e. one operating voltage supply block 8 transforms the supply voltage $V_{S2}$ to an operating voltage $V_{CC2}$ greater than the supply voltage $V_{S2}$. With this arrangement, the allowed supply voltage range can be expanded further.

The invention can also be applied in such a way that if several different operating voltages are needed in the electronic device, the method of the invention is used in the formation of each operating voltage.

The present invention is not limited solely to the embodiments presented above, but it can be modified within the scope of the appended claims.

What is claimed is:

1. A method for forming an operating voltage ($V_{CC2}$) within a first electronic device (1) limited to voltage levels between a maximum level (Vmax) and a minimum level (Vmin) from a voltage supply (Vs2) of a second electronic device (2) wherein the first electronic device is adapted for coupling to and from the first electronic device (1), the method comprising the following combination of steps considered together, coupling the supply voltage (Vs2) of the second electronic device to first (7) and second (8) operating voltage supply blocks of the first electronic device (1) for creating a limited operating voltage (Vcc2) for the first electronic device (1), using the first operating voltage supply block (7) to limit the operating voltage (Vcc2) to a level below the maximum voltage level (V3), determining for the operating voltage (Vcc2) at least a first limiting voltage (V3) that is lower than the maximum voltage (Vmax), comparing the supply voltage (Vs2) to the first limiting voltage (V3) and, if supply voltage (Vs2) is greater than the first limit voltage (V3), activating the first voltage supply block (7) to form the operating voltage (Vcc2) from the supply voltage (Vs2) and limiting the output of the operating voltage supply block to a voltage level (V3) below the maximum voltage (Vmax) and if the supply voltage (Vs2) is substantially smaller than the first limit voltage (V3), and activating the second voltage supply block (8) to form the operating voltage (Vcc2) from the supply voltage (Vs2).

2. The method of claim 1 further including the steps of determining a second limit value (V4) that is smaller than the first limit value (V3) and comparing the supply voltage (Vs2) with the second limit value (V4) and, if (Vs2) is smaller than limit (V4), using the second operating voltage supply block (8) to form the operating supply voltage (Vcc2).

3. The method of claim 2 further including the step of measuring the supply voltage (Vs2) to compare that voltage to a limit voltage.

4. An electronic system comprising the following elements considered together, a first electronic device (1) for coupling to a second electronic device (2) by a connector (10) for accessing a supply voltage (Vs2) of the second electronic device (2) to form an operating voltage (Vcc2) for the first electronic device (1) while coupled thereto, first and second voltage supply blocks (7) and (8) coupled to the supply voltage (Vs2) of the second electronic device (2) for forming an operating voltage (Vcc2) from the supply voltage (Vs2) of the second electronic device (2) including determining a minimum voltage level ($V_{min}$) and a maximum voltage level ($V_{max}$) for the operating voltage (Vcc2), a microprocessor (3) coupled to a memory (4) for storing and retrieving voltage limit levels for the operating voltage (Vcc2), an analog-to-digital converter ("ADC") (9) coupled to the supply voltage (Vs2) of the first electronic device for comparing the supply voltage (Vs2) to stored voltage limit levels stored in memory, microprocessor (3) further coupled to the first (7) and second (8) voltage supply voltage by control lines (18) and (19) for activating the first operating voltage supply block (7) if the supply voltage ($V_{S2}$) is at a higher voltage level than a first stored limit value (V3) and for activating the second operating voltage supply block (8) if the supply voltage ($V_{S2}$) is at a substantially lower stored voltage level than said first limit value (V3).

5. The system of claim 4 further including a second determined limit voltage level (V4) within the first electric device (1) that is at a lower voltage level limit than the first limit value (V3), wherein when the supply voltage ($V_{S2}$) is lower than said second limit value (V4), the second operating voltage supply block (8) is activated to form the operating voltage ($V_{CC2}$) from the supply voltage ($V_{S2}$).

6. The system of claim 4 wherein electronic device (1) includes an operational amplifier (OP) including a feedback resistor (R1), a bias resistor (R2), and a reference voltage resistor (Vref) coupled at an output to voltage supply block (7) when Vs2 is greater than limit voltage (V4) and coupled to voltage supply block (8) when (Vs2) is substantially smaller than voltage (V3).

7. The system of claim 4 wherein the first voltage supply block (7) of the electronic device (1) includes a switched mode power supply (SMPS).

8. The system of claim 4 wherein the second voltage supply block (8) of the electronic device (1) includes a field effect transistor (FET) (T1).

9. The system of claim 4 wherein the first electronic device (1) is an expansion card.

10. The system of claim 4 wherein the first electronic device (1) is a wireless communication device.

11. The system of claim 4 wherein the first electronic device (1) is a PCMCIA expansion card.

* * * * *